United States Patent
Kawaike et al.

(10) Patent No.: US 6,937,035 B2
(45) Date of Patent: Aug. 30, 2005

(54) METHOD AND APPARATUS FOR INSPECTING PRINTED CIRCUIT BOARDS

(75) Inventors: Noboru Kawaike, Kyoto (JP); Kenji Ueda, Kyoto (JP); Kenji Matsui, Kyoto (JP)

(73) Assignee: Omron Corporation, Kyoto-fu (JP)

( * ) Notice: Subject to any disclaimer, the term of this patent is extended or adjusted under 35 U.S.C. 154(b) by 32 days.

(21) Appl. No.: 10/198,739

(22) Filed: Jul. 19, 2002

(65) Prior Publication Data

US 2003/0016026 A1 Jan. 23, 2003

(30) Foreign Application Priority Data

Jul. 19, 2001 (JP) ........................................ 2001-220081

(51) Int. Cl.$^7$ ............................................. G01R 31/26
(52) U.S. Cl. ...................................................... 324/750
(58) Field of Search ................................ 324/247, 263, 324/512, 522, 529–530, 537–538, 750, 765, 158.1

(56) References Cited

U.S. PATENT DOCUMENTS

| | | | | |
|---|---|---|---|---|
| 3,992,663 | A | * 11/1976 | Seddick | 324/529 |
| 4,074,188 | A | * 2/1978 | Boatman et al. | 324/537 |
| 5,218,294 | A | * 6/1993 | Soiferman | 324/158.1 |
| 5,424,633 | A | * 6/1995 | Soiferman | 324/158.1 |
| 5,517,110 | A | * 5/1996 | Soiferman | 324/158.1 |
| 5,821,759 | A | * 10/1998 | Scaman et al. | 324/529 |
| 6,201,398 | B1 | * 3/2001 | Takada | 324/537 |
| 6,529,019 | B1 | * 3/2003 | King et al. | 324/750 |
| 6,630,832 | B1 | * 10/2003 | Harzanu et al. | 324/537 |

FOREIGN PATENT DOCUMENTS

| | | |
|---|---|---|
| JP | 57-007569 | 1/1982 |
| JP | 62-187258 | 8/1987 |
| JP | 03-039989 | 2/1991 |
| JP | 04-372879 | 12/1992 |
| JP | 08-105926 | 4/1996 |
| JP | 09-222454 | 8/1997 |
| JP | 09-061486 | 3/1998 |
| JP | 10-073427 | 3/1998 |
| JP | 10-206480 | 8/1998 |
| JP | 10-311-859 | 11/1998 |
| JP | 11-223652 | 8/1999 |
| JP | 2000-028669 | 1/2000 |
| JP | 2000-230959 | 8/2000 |

* cited by examiner

*Primary Examiner*—Minh N. Tang
(74) *Attorney, Agent, or Firm*—Foley & Lardner LLP

(57) ABSTRACT

A detection unit for detecting an electric field or a magnetic field is placed above a circuit to be detected. A control device allows the detection unit 4 to carry out detection processes while moving the detection unit in a predetermined direction with an electric current being applied to the circuit board so that an electric field distribution or a magnetic field distribution on the circuit board is detected. Moreover, the control device compares the results of the diction with reference data that has been preliminarily registered, and if there is any portion between the two pieces of data that is not coincident with each other, it is determined that the corresponding circuit board is a defective circuit board. Thus, it is possible to detect any defective portion on the printed circuit with high precision in a non-contact state to the circuit board.

4 Claims, 16 Drawing Sheets

Fig. 2
(1)
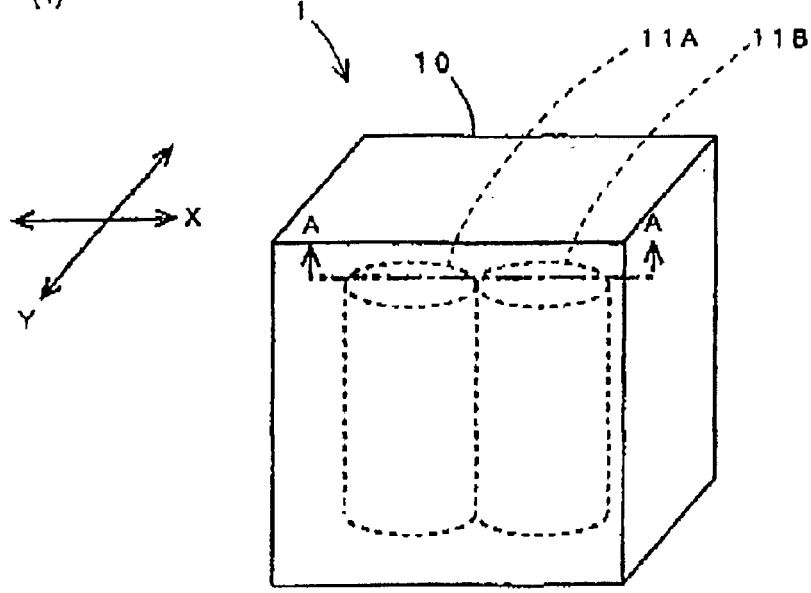
(2)
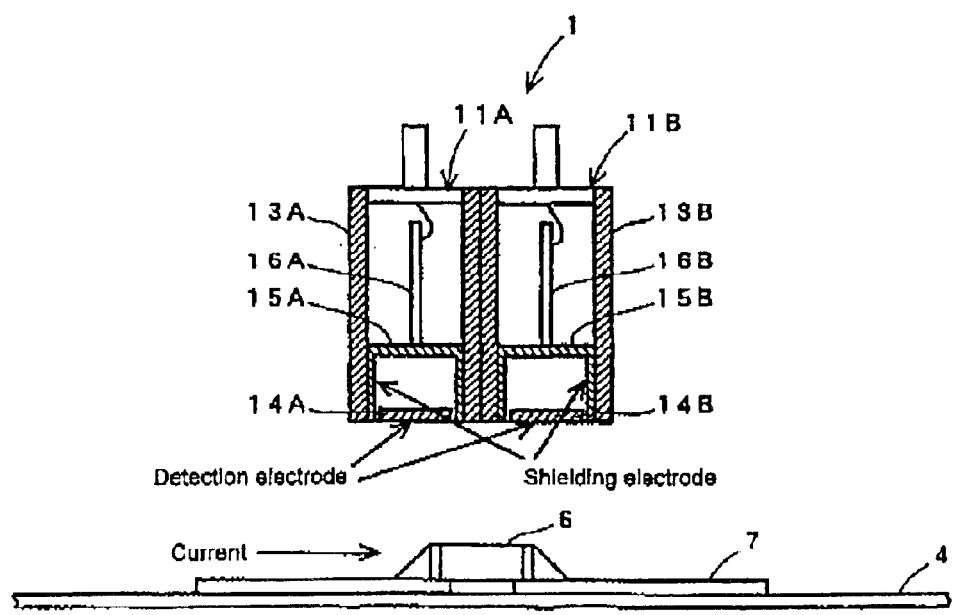

Fig. 5
(1)
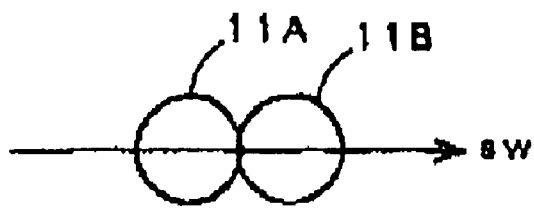
(2)
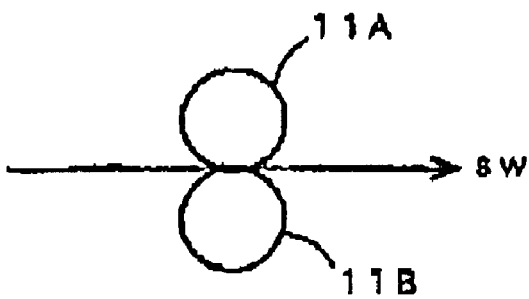
(3)
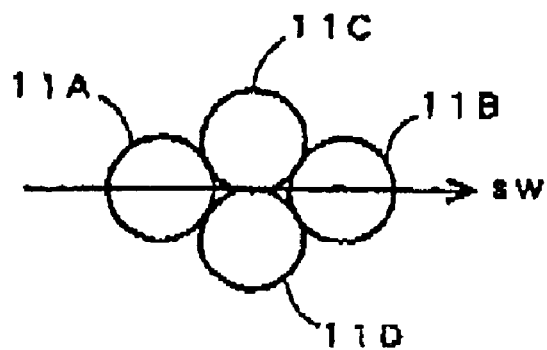

| | <Normal> | <Disconnection> | <Short-circuiting> |
|---|---|---|---|
| (1) Wiring pattern | $I = Vs/Rs$ | $I = 0$ | $I \to \infty$ or $I = Vs/Rs$ |
| (2) Resistor<br>Resistance value = RI | $I = Vs/RI$ | $I = 0$ | $I \to \infty$ |
| (3) Diode<br>Forward direction voltage = Vf | $I = (Vs - Vf)/Rs$ | $I = 0$ | $I \to \infty$ or $I = Vs/Rs$ |
| (4) Capacitor<br>Charge voltage = Vc | $I = (Vs - Vc)/Rs$ | $I = 0$ | $I \to \infty$ or $I = Vs/Rs$ (all the time) |

Fig. 10

| | <Normal> | < Disconnection > | <Short-circuiting> |
|---|---|---|---|
| (1) Wiring pattern | $I = Vs/Rs$ | $I = Vs/Rs$<br>$i1 = 0$ | $I \to \infty$<br>or<br>$I = Vs/Rs$ |
| (2) Resistor<br>Resistance value = Rl | $I = Vs/Rl//Rl//Rl$ | $I = Vs/Rl//Rl$<br>$i1 = 0$ | $I \to \infty$ |
| (3) Diode<br>Forward direction voltage = Vf | $I = (Vs - Vf)/Rs$ | $I = (Vs - Vf)/Rs$<br>$i1 = 0$ | $I \to \infty$<br>or<br>$I = Vs/Rs$<br>$i2, i3 = 0$ |
| (4) Capacitor<br>Charge voltage = Vc | $I = (Vs - Vc)/Rs$ | $I = (Vs - Vc)/Rs$<br>$i1 = 0$ | $I \to \infty$<br>or<br>$I = Vs/Rs$ (all the time)<br>$i2, i3 = 0$ |

Fig. 11
(1) 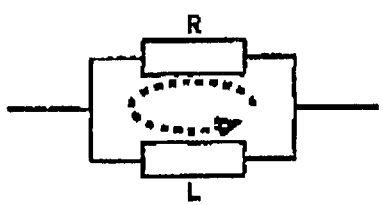
(2) 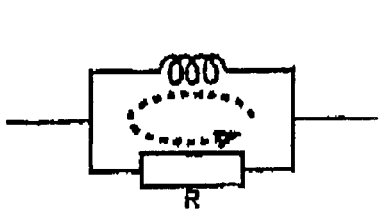
(3) 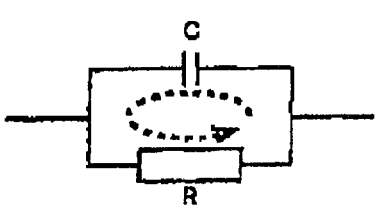
(4) 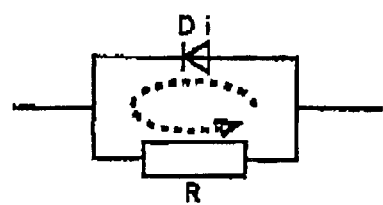
(5) 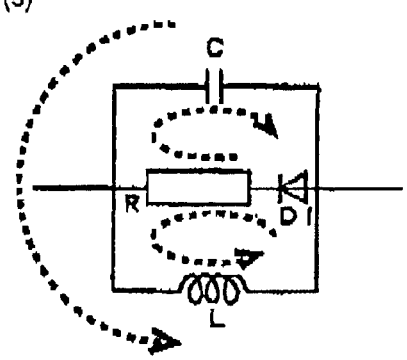

Fig. 15
(1)
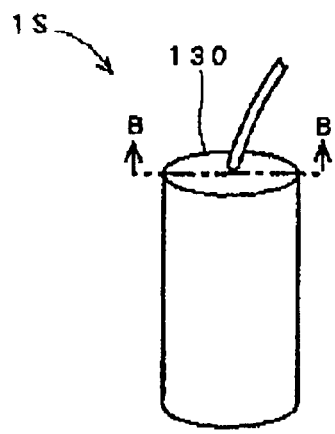
(2)
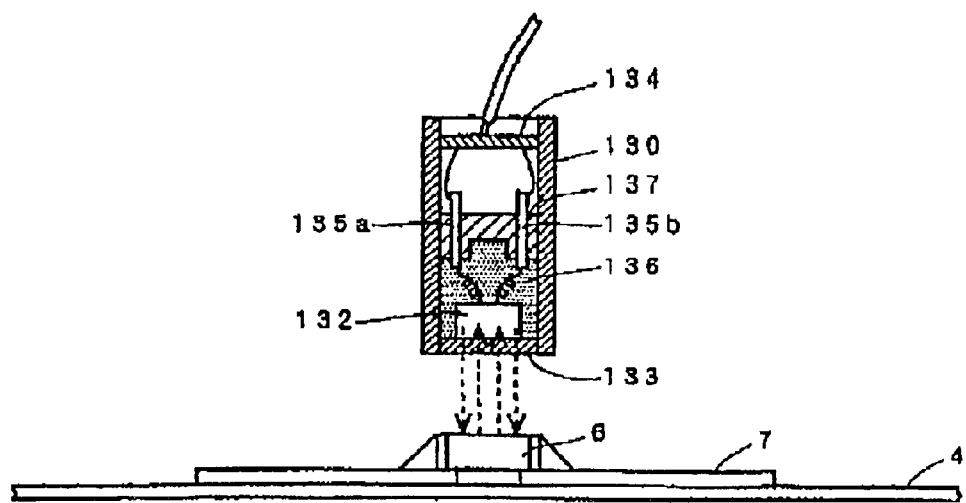

Fig. 17
(1) Normal
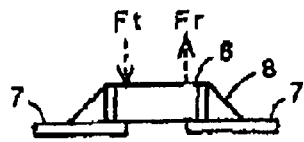
(2) Part cracking, disconnection
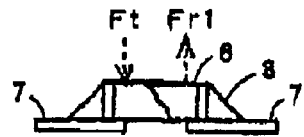
Receiving wave level Fr1 < Fr
(3) Defective soldering
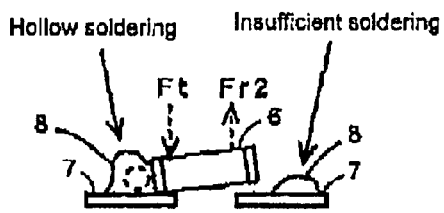
Receiving wave level Fr2 < Fr
(4) Wiring pattern cracking, disconnection
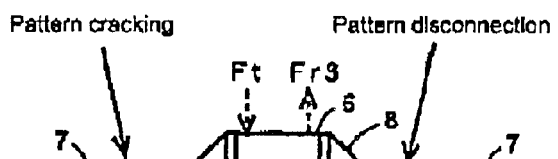
Receiving wave level Fr3 < Fr

METHOD AND APPARATUS FOR INSPECTING PRINTED CIRCUIT BOARDS

BACKGROUND OF THE INVENTION

1. Field of the Invention

The present invention relates to a technique for inspecting a circuit board on which various parts are packaged (hereinafter, referred to as "printed circuit board") for any defect such as a disconnection and a short-circuiting of a wire pattern, a defective part, a positional deviation, a raised state of a part, insufficient and exceeding soldering processes and a breakdown of a part.

2. Description of the Background Art

With respect to inspections of this type, conventionally, an inspection using an in-circuit tester has been carried out. In this inspection, as shown in FIG. 20, after an electric current has been applied to a printed circuit board 4, two points are selected from a wiring pattern 7 and terminals 6a, 6b of a part 6 to be inspected, and test probes 31, 32 are applied to these points so that factors, such as an electric current, a voltage, an impedance or a frequency, are measured between the two points with which these probes 31, 32 have been made in contact, and when the measured value is an abnormal value, it is determined that there is any defect between the above-mentioned two points.

In addition to this method, an inspection using a visual recognition device is sometimes carried out. In this inspection, while inspection areas are being successively set on a circuit board to be inspected, respective images are picked up so that, based upon the state of the resulting image, a determination is made as to whether or not any defect exists therein; and devices for carrying out inspections of this type are classified into visual inspection type devices in which an inspector visually inspects the images so as to determine the quality of the circuit board, and automatic inspection type devices in which, based upon predetermined reference data, a computer determines whether or not there is any defect.

Along with the recent developments in printed circuit boards with high-density, extremely fine parts and wiring patterns, it has become difficult to correctly put test probes onto portions to be inspected in the case of inspections using an in-circuit tester. Moreover, when test probes are put onto a printed circuit board having a high density, the circuit board might be damaged due to a disconnection in the wiring pattern. In the case of a circuit board used for an apparatus requiring a high degree of safety, a redundant circuit such as a duplexed circuit is formed therein, and with respect to such a redundant circuit, test probes are put at a position before the branch of the respective circuits and at a position after the branch; therefore, even when there is any defect in one portion of the pattern, if the other pattern is normal, the detected electrical potential by the test probes shows the same value as the normal value, thereby failing to properly detect a defect.

Here, in the case of the inspection using a visual recognition device, when a defective portion is extremely small or a degree of a defect is very small, the defect might be ignored. Moreover, with respect to parts that have been packaged by using a face-down packaging method, since connecting portions cannot be recognized from the face side of the circuit board, it is impossible to carry out the detecting process by using a visual recognition device.

SUMMARY OF THE INVENTION

The present invention has been devised to solve the above-mentioned problems, and its objective is to detect defective portions on a printed circuit board in a non-contact state to the circuit board, with high precision.

When an electric current is applied to a printed circuit board, an electric field distribution and a magnetic field distribution are generated in response to a circuit construction on the circuit board. In this case, if there is any defect such as a disconnection or short-circuiting of a predetermined wiring pattern on the circuit board and a breakdown of a certain part, and if the electric potential or the current at this detective portion shows a value different from a normal value, the distribution states of the electric field and the magnetic field are varied correspondingly.

The first method of the present invention, which has been devised by taking this principle into consideration, has an arrangement in which: a current is applied to a printed circuit board to be detected, and relative positions to said printed circuit board are varied with a non-contact state to the printed circuit board being maintained so that the distribution state of an electric field or a magnetic field on the above-mentioned circuit board is detected, and based upon the results of the detection, a determination is made as to whether or not any defect exists in the circuit board.

In order to detect the distribution state of an electric field or a magnetic field on the above-mentioned circuit board by varying relative positions to the circuit board with a non-contact state to the printed circuit board being maintained, for example, an electric-field detecting or magnetic-field detecting sensor is set at a position above the circuit board, and while this sensor is being moved in the direction along the surface of the circuit board, detecting processes are carried out at a plurality of positions. The determination as to whether or not any defect exists is carried out by comparing the electric field distribution or the magnetic field distribution detected as described above with an optimal distribution state that is obtained when there is no defective portion. In other words, if there is any portion in the detected distribution state that is different from the optimal distribution state, it is possible to determine that any defect is occurring in the corresponding different portion.

Next, with respect to a printed circuit board having no current applied thereto, an eddy current can be generated in a closed loop on the circuit board by using an electromagnetic induction function. Here, in the case when the state of the closed loop is different from the normal state due to a disconnection or short-circuiting, etc., no eddy current is generated, or an eddy current having a state different from the normal state might be generated.

The second method of the present invention, which has been devised based upon the above-mentioned principle, has an arrangement in which: a magnetic field is exerted on a printed circuit board so that an eddy current is generated in a closed loop formed by a conductor portion including patterns on the circuit board or patterns and packaged parts on the circuit board, and a distribution state of a magnetic field generated by the eddy current is detected with a non-contact state to said printed circuit board being maintained so that it is determined whether or not any defect exists in the circuit board based upon the results of the detection.

In order to generate an eddy current on a circuit board and to detect the distribution state of a magnetic field caused by the electric current with a non-contact state to the printed circuit board being maintained, for example, a magnetic-field detecting sensor, which has a function for generating an induction magnetic field, is placed at a position above the circuit board, and while relative positional relationship between this sensor and the circuit board is being changed, detecting processes are carried out. With respect to the determination as to whether or not any defect exists, the same process as the first method is carried out, that is, it is possible to determine whether or not any defect exists by comparing the electric field distribution detected as described above with an optimal distribution state that is obtained when there is no defective portion.

Here, the eddy current may be generated at an area centered on the circuit in question; however, not limited to this method, the eddy current may be generated on the entire portion of the circuit board.

In the case when an ultrasonic wave is discharged to a part and a wiring pattern on a circuit board and the reflected wave is received, if there is any defect such as a crack in the part, a positional deviation or a slated mounting of the part, and a disconnection in the wiring pattern, the degree of reflection of the ultrasonic wave becomes different from the normal state, resulting in a change in the level of the reflected wave to be received.

The third method of the present invention, which has been devised based upon the above-mentioned principle, has an arrangement in which: an ultrasonic wave having a predetermined frequency is discharged to a printed circuit board to be inspected from a position slightly apart from the circuit board so that the reflected wave from the circuit board is detected, and based upon the results of the detection, a determination is made as to whether or not any defect exists in the circuit board.

The transmission and receipt of ultrasonic waves are carried out by using a sensor having transmitting and receiving functions of ultrasonic waves. In this case, this sensor is placed at a position above a circuit board, and detection processes are carried out on a plurality of positions on the circuit board while varying the relative positional relationship between the sensor and the circuit board. Thus, it is possible to determine whether or not any defect exists by comparing the level of the reflected wave thus detected at each position with an optimal level that is obtained when there is no defective portion.

Here, in any of the first to third methods, in order to determine whether or not any defect exists, it is preferable to preliminarily carry out detection processes on good circuit boards without any defect under the same conditions as the circuit board to be inspected, and to register the results of detection as reference data so that the results of detection obtained upon inspection with respect to an inspected printed circuit board are compared with the above-mentioned reference data.

In any of the above-mentioned methods, a circuit board is observed in a non-contact state to the circuit board by a method except for the image-pickup method, and the determining process is carried out by detecting a physical quantity representing whether or not any defect exists. Here, even when the defective portion is extremely small or the degree of the defect is small, by obtaining the detected physical quantity (a state of change in the electric field or magnetic field, or a level of a reflected wave of the ultrasonic wave) as a voltage that is sufficiently great, it is possible to detect this defect with high precision, and even when the inspection object is a circuit board with high density, it is possible to carry out the inspection with high precision without causing any damage to the circuit of the circuit board. Moreover, with respect to a circuit including a part formed by a face-down assembling process, it is possible to carry out inspection processes in a non-contact state.

Moreover, in any of the above-mentioned methods, even when an area including circuit patterns or parts that constitute a redundant circuit is an object of inspection in the above-mentioned printed circuit board, it is possible to detect any defect occurring in any one of the branched circuits, and consequently to greatly improve the inspection precision.

Here, in the first method of the above-mentioned three methods, any defect is detected based upon a change in the electric field or magnetic field in response to an electric potential or an electric current occurring in the circuit upon application of a current; therefore, if, even when a defect such as short-circuiting occurs, the defect causes no abnormal value in the electrical potential and current in the defective portion in association with the other circuits, it becomes impossible to detect the defect. In contrast, in the second and third method, the determining process is carried out by using a physical quantity representing a state of a wiring pattern and a part without applying any current to the circuit board, it becomes possible to detect a defective portion that the first method would fail to detect.

Moreover, the present invention provides apparatuses that inspect a printed circuit board by using the above-mentioned first to third methods.

An apparatus in accordance with the first method is provided with: a detection unit which detects a distribution state of an electric field or a magnetic field on the circuit board while being set in a non-contact state with respect to the printed circuit board; a position adjusting means for adjusting a relative positional relationship between the detection unit and the circuit board; and a control means which controls the position adjusting means so as to allow the detection unit to coincide with a predetermined plurality of positions on the circuit board in succession so that a determination is made as to whether or not any defect exists in the circuit board by using detection signals of the respective positions from the detection unit.

In the case when the above-mentioned detection unit detects an electric field, the detection unit is provided with a detection electrode which allows an electrostatic capacity to be exerted between the circuit board and the detection unit so as to detect this electrostatic capacity, and a shielding electrode that is used for shielding influences of an electric field from a direction other than the circuit board from being exerted on the detection electrode. Moreover, in the case when the determining process is carried out by using a magnetic field, the detection unit is preferably provided with devices such as a magnetic resistor element like an magnetic induction (MI) element and an oscillator for allowing a high frequency current to flow this element, and a means like a bias magnet for generating a bias magnetic field so as to improve the sensitivity of the element.

Here, in the case when either of the electric field and magnetic field is detected, the detection unit is desirably arranged so that an electric field or a magnetic field is detected at a plurality of positions so as to eliminate noise signals and to output a differential signal (that is, a change in the electric field or magnetic field in a predetermined pitch) of the detection signals obtained from the respective positions.

The above-mentioned position adjusting means may be designed so as to adjust either of the positions of the detection unit and the circuit board. Alternatively, a mechanism for adjusting positions is placed in each of the detection unit and the circuit board so that the positional adjustment may be carried out in mutually different directions, such as, in the X direction for the detection unit and in the Y direction for the circuit board.

The control means, which controls the position adjusting operation of the above-mentioned position adjusting means and the detection operation of the detection unit, and acquires a detection signal from the detection unit so as to carry out the corresponding processes, is prepared as a control circuit that is mainly constituted by a computer. Moreover, a memory, which stores inspection conditions, such as the inspection areas on a circuit board and timing in which the detection unit is operated in the respective inspection areas, and reference data used for determining whether or not any defect exists, may be installed in the control circuit.

An apparatus in accordance with the second method is provided with: a detection unit which applies a magnetic field onto the circuit board to generate an eddy current in a closed loop formed by a conductor portion including patterns on the circuit board or patterns and packaged parts oh the circuit board to detect a distribution state of the magnetic field generated in the circuit board by the eddy current, while being set in a non-contact state with respect to said printed circuit board: position adjusting means for adjusting a relative positional relationship between said detection unit and the circuit board; and control means which controls said position adjusting means so as to allow the detection unit to coincide with a predetermined plurality of positions on the circuit board in succession so that a determination is made as to whether or not any defect exists in the circuit board by using detection signals of the respective positions from the detection unit.

The detection unit in the apparatus having the second arrangement is constituted by an exciting coil for exerting a high frequency magnetic field onto the circuit board and a, detecting coil or a magnetic resistor element for detecting a magnetic field generated by an eddy current. Here, the detection unit having this arrangement is preferably designed so that a magnetic field from the circuit board is detected from a plurality of positions and so that a differential signal from the results of the respective detections is outputted.

Moreover, since a voltage, induced by an ac magnetic field, tends to have a deviation in the phase depending on circuit constructions, the above-mentioned detection unit is preferably provided with a circuit for selecting the phase signal of a detection signal and a circuit which simultaneously detects a plurality of phase signals in a separated manner.

The position adjusting means and the control means are designed in the same manner as those of the apparatus of the first method. Here, in the case when a phase signal is selected and detected in the detection unit, data, which indicates which phase signal to be selected for each of the detection positions, may be set, and stored in a memory in the determination processing means.

Furthermore, an apparatus in accordance with the third method is provided with: a detection unit which discharges a ultrasonic wave having a predetermined frequency to detect a reflected wave from the circuit board while being set in a non-contact state with respect to the printed circuit board; a position adjusting means for adjusting a relative positional relationship between said detection unit and the circuit board; and a control means which controls the position adjusting means so as to allow the detection unit to coincide with a predetermined plurality of positions on the circuit board in succession so that a determination is made as to whether or not any defect exists in the circuit board by using detection signals of the respective positions from the detection unit.

The detection unit in the above-mentioned arrangement is provided with devices, such as a piezoelectric element for transmitting and receiving ultrasonic waves, a circuit for processing a detection output from this piezoelectric element and a buffer member. The position adjusting means and the control means are arranged in the same manner as those in the first method.

In any of the apparatuses having the above-mentioned three arrangements, the detection unit is placed in a non-contact state to a printed circuit board to be inspected, and detection processes are successively carried out with respect to a plurality of positions of the circuit board in the non-contact state to the circuit board while the relative positional relationship between the detection unit and the circuit board is being varied to determine whether or not any defective portion exists. This determining process may be carried out each time a detecting process is executed on each inspection subject on the circuit board; however, the determining process may be carried out at once after completion of the detecting processes with respect to all the inspection subjects.

Moreover, each apparatus having any of the arrangements may be provided with a display means for displaying the results of the determination by the above-mentioned determination processing means, a means for externally outputting the results of the determination and a means for storing the results of the determination in a predetermined storing medium (including an inner memory).

Additionally, in the case when an apparatus having the first arrangement is used, the inspecting process is carried out with a current being applied to the circuit board to be inspected, while in the case of apparatuses having the second and third arrangements, the inspecting process is carried out with no current being applied to the circuit board.

BRIEF DESCRIPTION OF THE DRAWINGS

FIG. 2 is a drawing that shows an inner structure of a detection unit.

FIG. 5 is a drawing that shows the relationship between the moving direction of the detection unit and the layout of a sensor unit.

FIG. 10 is a drawing that shows current modes in a redundant circuit for each of the cases.

FIG. 11 is a drawing that shows an example in which an eddy current is generated.

FIG. 15 is a drawing that shows a structure of a detection unit to be used in a third inspection apparatus.

FIG. 17 is a drawing that shows a case in which a detection of any defect is carried out by transmitting and receiving an ultrasonic wave.

DESCRIPTION OF THE PREFERRED EMBODIMENTS

Figure 1:
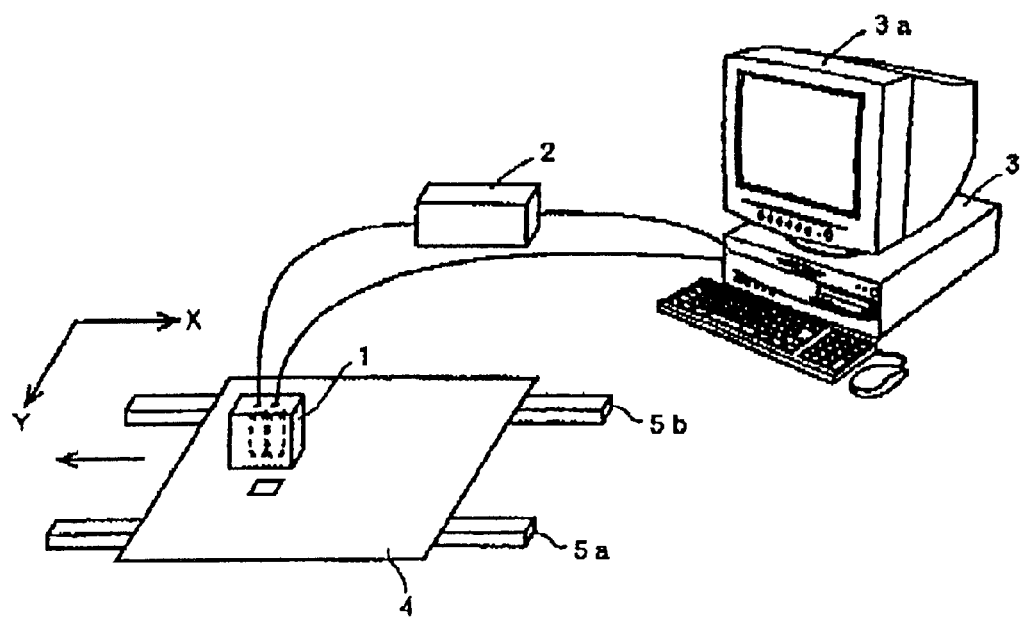
FIG. 1 is a drawing that shows a schematic structure of a first inspection apparatus in accordance with the present invention.

FIG. 1 shows a schematic structure of an inspection apparatus in accordance with one preferred embodiment of the present invention. This inspection apparatus is used for detecting defects such as a disconnection and short-circuiting of a wiring pattern, a breakdown and a defective mounting of a part on a printed circuit board 4 (hereinafter, simply referred to as "circuit board 4") in a non-contact state to the circuit board 4, and is constituted by a detection unit 1 placed at a position above the circuit board 4, as well as a position adjusting device 2, a control device 3, etc.

A circuit board 4 to be inspected is placed on transporting-use rails 5a, 5b, and is transported by a driving mechanism, not shown, and positioned to a predetermined inspection position. The above-mentioned position adjusting device 2 controls a positioning mechanism (not shown) in the detection unit 1 so that the position of the detection unit 1 is adjusted in the respective X and Y axis directions.

The control device 3, which controls the operations of the position adjusting device 2 and the detection unit 1, and determines whether or not any defect exists in the circuit board 4, is constituted by a personal computer. The memory of this control device 3 stores the kinds and mounting positions of packaging parts, wiring patterns between the parts, inspection areas, conditions for inspection, reference data that forms a criteria of determination in the inspection (hereinafter, referred to as "inspection-use data") and programs used for carrying out a sequence of inspections, with respect to the circuit board 4 to be inspected. Based upon these programs and inspection-use data, after having shifted the inspection unit 1 successively to each inspection area, the control device 3 allows the inspection unit 1 to carry out a detection process in the inspection area, while moving the detection unit 1 in a predetermined direction (for example, X-direction).

Upon completion of the detection processes on all the inspection areas, the control device 3 compares respective detection signals with the reference data to determine whether or not there is any defective portion in the above-mentioned circuit board 4. The results of the determination are displayed on an attached monitor 3a of the control device 3, and may be transmitted to another device through a data transmission path, not shown.

Here, the above-mentioned inspection subject areas and reference data are registered in the control device 3 through a teaching process prior to the inspection.

In the inspection device having the above-mentioned arrangement, an inspection process is carried out with a current being applied to the circuit board 4, and the distribution state of an electric field or a magnetic field exerted on the surface of the circuit board 4 is detected by the inspection unit 1, and the distribution state is compared with the reference data registered through the teaching process so that a determination is made as to whether or not there is any defective portion.

FIGS. 2(1) (2) show a construction of the detection unit 1 that is used when the electric field distribution of the circuit board 4 is detected. The detection unit 1 of the present preferred embodiment is constituted by two sensor units 11A, 11B that are placed in parallel with each other in a case main body 10, and this is positioned above a part 6 and a wiring pattern 7 on a circuit board 4 so as to carry out a detection process. As shown in cross-sectional views of FIG. 2 (2) the respective sensor units 11A, 111 are provided with detection electrodes 14A, 14B, shielding electrodes 15A, 15B, sensor substrates 16A, 16B, etc. that are respectively housed inside cylinder-shaped cases 13A, 13B. The detection electrodes 14A, 14B, which have a plate shape, are supported at lower positions of the cylinder cases 13A, 13B in a manner so as to maintain its upper and lower faces horizontally. Here, shielding electrodes 15A, 15B are formed into a cylinder shape with its end being opened, and placed in a manner so as to surround the detection electrodes 14A, 14B with the opened end facing down. In this arrangement, holes 12A, 12B (shown in FIG. 3) through which wires from the detection electrodes 14A, 14B are passed are formed on the upper face of these shielding electrodes 15A, 15B.

Figure 3:
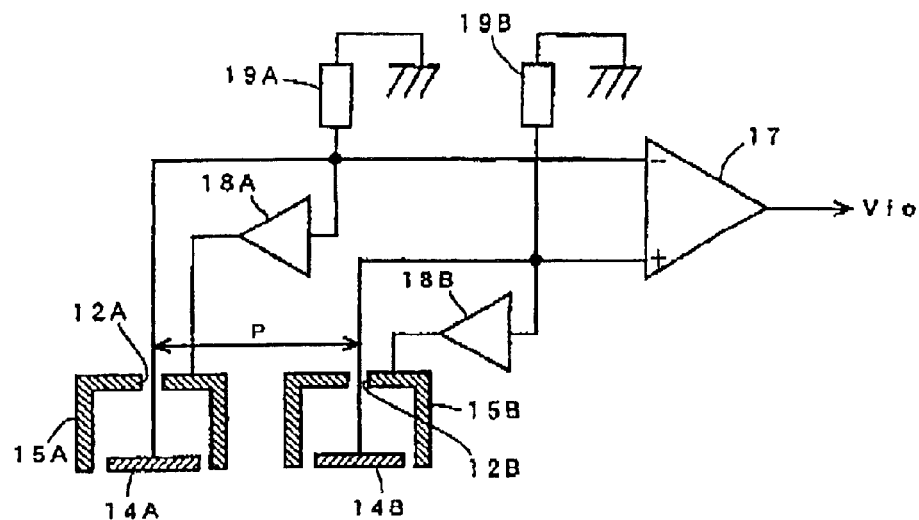
FIG. 3 is a drawing that shows an electrical structure of the detection unit.

FIG. 3 shows an electrical construction of the above-mentioned detection unit 1.

The detection electrodes 14A, 14B of the respective sensor units 11A, 11B are connected to ground through high resistors 19A, 19B, and these connections allow voltages corresponding to the electrostatic capacities between the circuit board 4 and the detection electrodes 14A, 14B to be taken out (hereinafter, this voltage is referred to as "detection voltage"). The respective detection voltages are inputted to a differential amplifier 17 so that a differential signal Vio from this differential amplifier 17 forms a detection signal to be inputted to the control device 3. Moreover, the detection voltages obtained by the respective detection electrodes 14A, 14B are respectively given to shielding electrodes 15A, 15B of the same sensor unit through buffer circuits 18A, 18B. Thus, the shielding electrodes 15A, 15B are set to the same electric potential as the detection electrodes 14A, 14B so that it is possible to prevent an electrostatic capacity from generating between the detection electrodes 14A, 143 and the shielding electrodes 15A, 15B; therefore, only an electric field from the circuit board 4 side is exerted on the detection electrodes 14A, 14B.

Here, among the circuit constructions shown in FIG. 3, those circuits located before the differential amplifier 17 are installed in the above-mentioned sensor substrates 16A, 16B on the respective sensor units 11A, 111, except for the electrodes 14A, 148, 15A, 15B. Moreover, the differential amplifier 17 is installed in another substrate within the case main body 10, together with an interface circuit, etc. to the control device 3, not shown.

Figure 4:
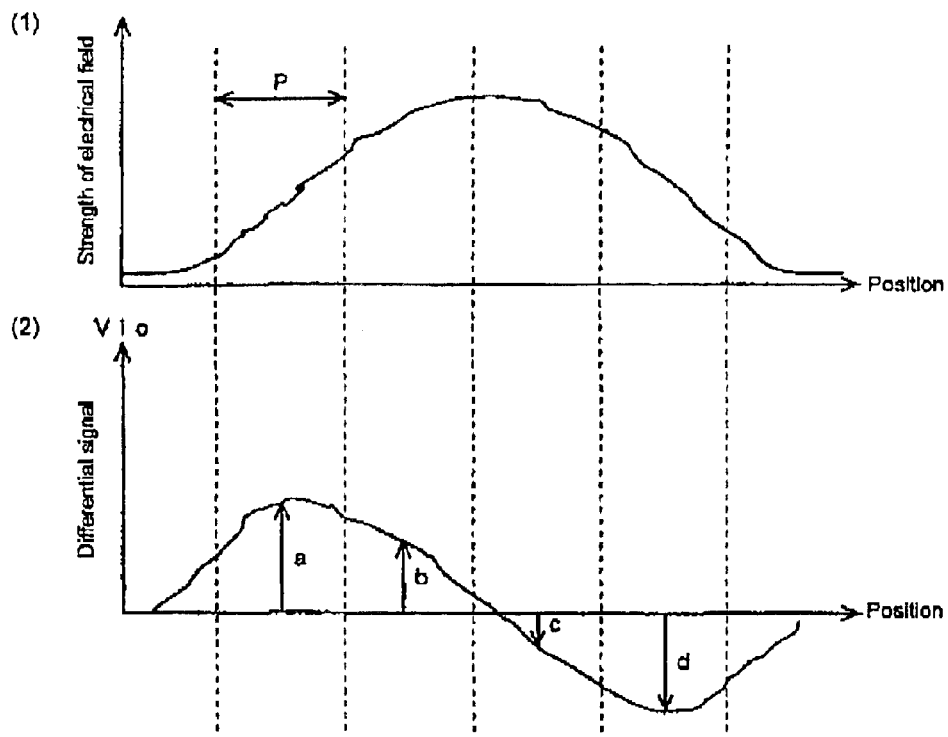
FIG. 4 is a graph that shows the relationship between an electric field distribution on a circuit board and the results of a detection.

FIG. 4 shows the relationship between an electric field distribution on the circuit board 4 and the results of the detection by the above-mentioned detection unit 1; FIG. 4(1) shows an electric field distribution along a predetermined direction on the circuit board 4; and FIG. 4(2) shows the results (the above-mentioned differential signal $Vi_0$) of the differential process carried out on the electric field distribution of FIG. 4(1).

In the respective Figs., a distance P between respective broken lines corresponds to the distance between the above-mentioned detection electrodes 14A, 14B, and FIG. 4(2) indicates the differential signal $Vi_0$ obtained when the differential process is carried out while the intermediate position between the detection electrodes 14A, 14B is made coincident with each of the positions shown on the lateral axis of FIG. 4(1) (for example, in FIG. 4(2), arrows a to d indicating the intermediate positions between the respective broken lines show the level of the differential signal $Vi_0$ obtained when the respective detection electrodes 14A, 14B correspond to the positions of the respective broken lines).

In accordance with the above-mentioned arrangement, the differential signal of the detected voltages from the respective detection electrodes 14A, 14B are obtained so that the distance P between the respective detection electrodes 14A, 14B is allowed to function as a space filter so that noise other than the electric field caused by the construction of the circuit board 4 can be eliminated; thus, it becomes possible to detect an electric field distribution that represents the state of a part 6 and a wiring pattern 7 on the circuit board 4.

FIG. 5 shows the relationship between the moving direction (indicated by arrow sw in the Figure) of the above-mentioned detection unit 1 and the layouts of the sensor units 11A, 11B. In accordance with the layouts of FIG. 5(1), the differential processes of the respective detection voltages are carried out in directions in accordance with the moving direction sw, and in accordance with the layouts of FIG. 5(2), the differential processes thereof are carried out in directions orthogonal to the moving direction sw; however, in the inspection apparatus having the first construction, either of the layouts of FIGS. 5(1) and 5(2) may be adopted. Moreover, as shown in FIG. 5(3), sensor units 11C, 11D having the same constructions as the above-mentioned sensor units 11A, 11B may be introduced, and by using these two sets of sensor units, the differential processes of the electric field distributions may be carried out in two directions, that is, a direction in accordance with the moving direction sw, and a direction orthogonal to the moving direction sw.

Figure 6:
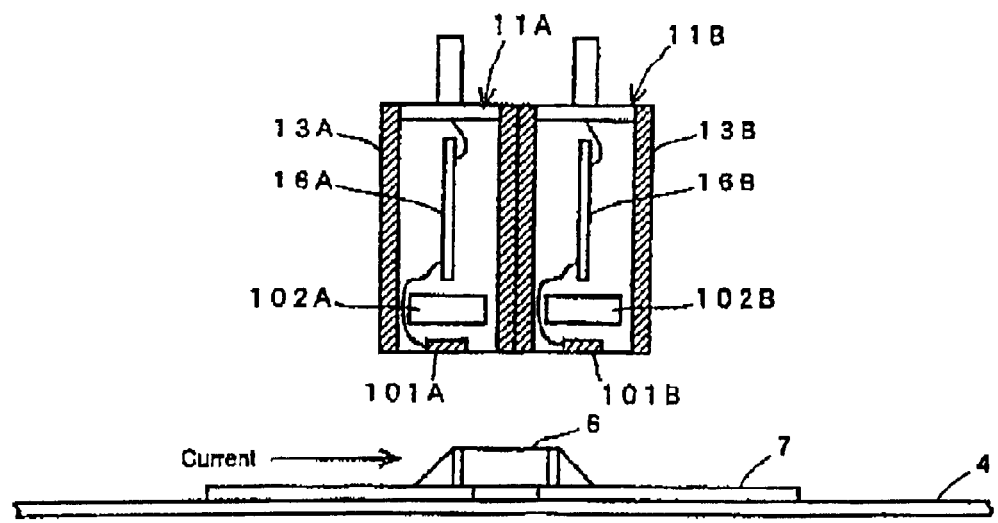
FIG. 6 is a drawing that shows another structure of the detection unit.

Next, FIG. 6 shows the structure of the detection unit 1 that is arranged so as to detect a magnetic field distribution of the circuit board 4. Here, the external appearance of the detection unit 1 is the same as the detection unit 1 used for the electric field detection, and a case main body 10 housing two sensor units 11A, 11B are supported so as to be freely shifted above an inspection position.

In the respective sensor units 11A, 11B, MI elements 101A, 101B are placed at lower positions within cylinder cases 13A, 13B having the same structure as that of FIG. 2(2), and bias magnets 102A, 102B, sensor substrates 16A, 163, etc., are housed above these elements. The MI elements 101A, 101B have a characteristic in which the impedance is varied in accordance with a variation in the magnetic field so that by applying a high-frequency current to these MI elements 101A, 101B, it is possible to obtain the variation in the impedance as a voltage. Moreover, the bias magnets 102A, 102B are used for setting a bias magnetic field on the detection area of the above-mentioned MI elements 101A, 101B.

Figure 7:
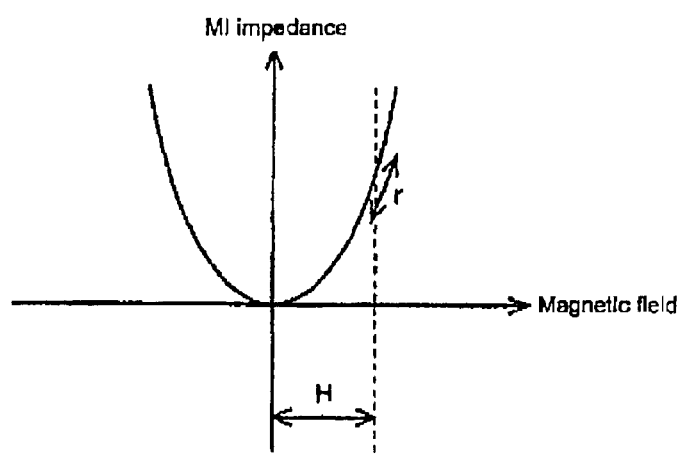
FIG. 7 is a drawing that shows a characteristic curve of an MI element.

FIG. 7 shows a change in the impedance caused by a change in the magnetic field when a current having a predetermined frequency is applied to the MI elements. In this manner, the impedance of the MI element is varied in a quadratic manner so that in this curve, the magnetic field H, obtained when the impedance is allowed to vary in a linear state (which refers to a change in the vicinity indicated by arrow r in the Figure), is set as a bias magnetic field, it becomes possible to improve the detection sensitivity of the MI element.

Figures 8, 9:
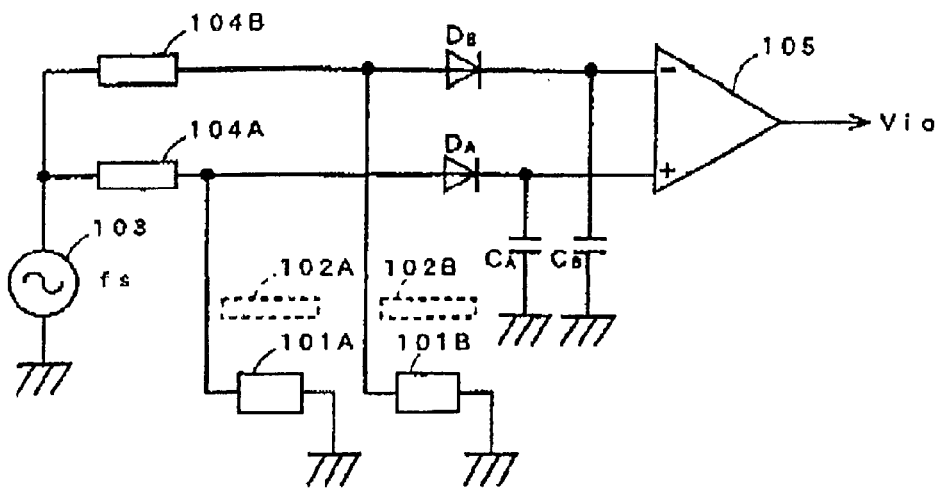
FIG. 8 is a drawing that shows an electrical structure of the detection unit shown in FIG. 6.
FIG. 9 is a drawing that shows current modes in a basic circuit for each of the cases.

FIG. 8 shows an electrical construction of the second detection unit 1.

In the Figure, reference numeral 103 represents an oscillator that generates a high frequency current of several tens of MHz. This high frequency current is applied to the respective MI elements 101A, 101B through resistors 104A, 104B, and an ac voltage, generated by the MI element 101A, is smoothed by a rectifying circuit constituted by a diode $D_A$ and a capacitor $C_A$, and taken out as a first detection voltage. In the same manner, with respect to the MI element 1015, a second detection voltage is taken out by a diode $D_B$ and a capacitor $C_B$. Further, these detection voltages are inputted to a differential amplifier 105 so that a differential signal $Vi_0$ forming a detection signal is generated.

In this manner, in this detection unit 1 for detecting a magnetic field, magnetic fields are detected from two points apart from each other with a predetermined distance by two sensor units 11A, 11D, and by finding a differential signal from these, noise is eliminated so that it is possible to detect a magnetic field distribution that represents the state of a part 6 and a wiring pattern 7 on the circuit board 4 with high precision.

Here, in the same manner as shown in FIG. 5, with respect to the second detection unit 1 also, the differential detection process of a magnetic field is carried out in either of the direction in accordance with the drawing direction sw and the direction orthogonal to the drawing direction sw. Moreover, it is possible to simultaneously carry out the differential detection processes in the two directions by using four sensor units 11A to 11D.

FIG. 9 shows respective current modes in the normal state, a state having a disconnection and a state having a short-circuiting with respect to a wiring pattern and basic parts (a resistor, a diode and a capacitor). Moreover, FIG. 10 shows the current modes in the same three cases on the assumption that a redundant circuit is formed by these wiring pattern and parts. Here, in the respective drawings, Vs represents a power-supply voltage, and Ra represents a current-regulating resistor. Moreover, in the Figure, arrows shown together with circuits in the left column indicate directions in which a current I flows. (This current I may be either an ac current or a dc current.) Moreover, in each of the disconnection and short-circuiting columns, the current mode different from a normal mode is indicated by a symbol with an underline. Here, FIG. 10 assumes a case in which a disconnection or a short-circuiting occurs in the circuit shown on the upper-most level.

As shown in FIG. 9, in a normal wiring pattern and part, upon having a disconnection, a current becomes zero. In the event of such a state in which no current flows in a certain circuit in the circuit board 4, since the electric field distribution and magnetic field distribution of the circuit board 4 also vary, it is possible to detect a portion having the disconnection by detecting this variation. Moreover, in the event of an over-current in the current I also, since the variation is reflected to the electric field distribution and the magnetic field distribution of the circuit board 4, it is possible to detect a portion having a short-circuiting by detecting the resulting variation.

Moreover, as shown in FIG. 10, with respect to a redundant circuit, even when a disconnection occurs in a certain portion of the wiring pattern and parts, the current I flowing through the entire circuit is maintained in the same state as the normal state. However, since the current it in the portion having the disconnection becomes zero, the electric field distribution and the magnetic field distribution of the circuit board 4 is varied due to this current change, and it is possible to detect the portion having the disconnection by detecting this change. Moreover, in the same manner, even in the event of an over-current in the current I flowing through a circuit due to a short-circuiting, it is possible to detect the portion having the short-circuiting by detecting the change in the electric field distribution and the magnetic field distribution caused by this current change.

Here, even in the event of a short-circuiting, no change is generated in the current I depending on the circuit construction having the short-circuiting (which corresponds to the current mode without an underline in the Figure.) In this case, since hardly any change occurs in the electric field distribution and the magnetic field distribution, it is impossible to carry out the detection. However, in the capacitor, since a current is always allowed to flow upon short-circuiting, it becomes possible to determine whether or not any defect exists by prolonging the detection time or carrying out detections a plurality of times ((4) of FIG. 9). Moreover, as shown in (3) (4) in FIG. 10, in a redundant circuit constituted by diodes and capacitors, since the currents (i2, i3) flowing through parts having no short-circuiting become zero, it is possible to detect any defective portion based upon a change in the electric field distribution and the magnetic field distribution.

As described above, in accordance with the above-mentioned inspection apparatus, since it is possible to detect any defect in a non-contact state to the circuit board 4, no damage is caused to the circuit board 4 upon detection. Even in the case when the defect is extremely small, if there is any change in the electric potential and the electric current in the defective portion, it is possible to detect the defect with high precision based upon a change in the electric field distribution and the magnetic field distribution.

The second inspection apparatus to be described next is designed so that defects including those which have not been detected by the first inspection apparatus can be detected. In this apparatus, a high frequency induction magnetic field is applied to the circuit board 4 from the detection unit 1 without applying a current to the circuit board 4 so that an eddy current is generated in a closed loop on the substrate 4, and by measuring a magnetic field generated on the circuit board 4 by the eddy current, it becomes possible to determine whether or not any defect exists.

When a high frequency induction magnetic field is exerted on the circuit board 4 to which no current is applied, an eddy current is generated in the circuit forming a closed loop on the circuit board 4 as shown in FIGS. 11(1) to 11(5) (in the Figures, arrows indicated by broken lines show the directions in which the eddy current flows). When, in such a closed loop, the state of the closed loop is changed due to a disconnection or a short-circuiting, the range in which the eddy current flows and the strength thereof are also varied; thus, the magnetic field distribution caused by the eddy current is also set to a state different from the normal state. Therefore, by making a check as to whether or not the distribution state of the magnetic field caused by the eddy current is appropriate, it is possible to determine where or not any defect exists on the circuit board 4.

Figure 12:
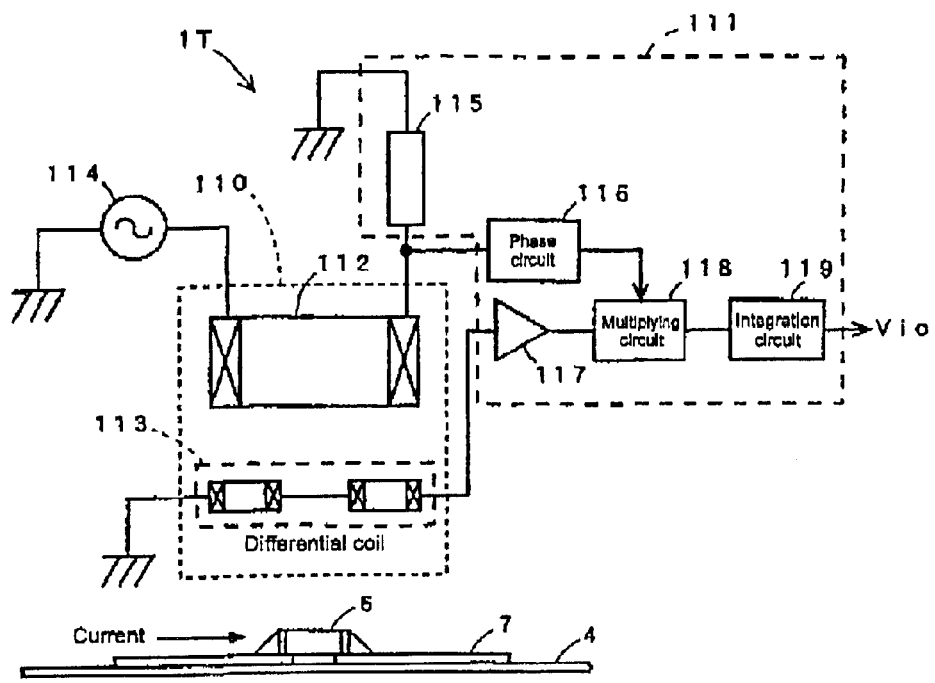
FIG. 12 is a drawing that shows an electrical structure of a detection unit to be used in the second inspection apparatus.

FIG. 12 shows a structural example of a detection unit 1T to be used in the second inspection apparatus. Here, since the construction of the entire inspection apparatus is the same as FIG. 1, drawings and descriptions thereof are omitted.

The detection unit 1T of the present preferred embodiment is constituted by a sensor main body 110 having an electromagnetic induction function and a processing circuit 111. The sensor main body 110, which is provided with an exciting coil 112 for applying a high frequency induction magnetic field to a circuit board, and a differential coil 113 for detecting a magnetic flux generated by the eddy current caused by this induction magnetic field, is designed so that, for example, the exciting coil 112 is placed on an upper position inside a case member with the differential coil 113 being placed at a position closer to the circuit board surface located below. Here, reference numeral 114 in the Figure represents an oscillator which allows a high frequency electric current to flow through the exciting coil 112, and reference numeral 115 is a resistor located between the exciting coil 112 and the ground potential.

The above-mentioned processing circuit 111 is constituted by a phase circuit 116, a preamplifier 117, a multiplying circuit 118, an integration circuit 119, etc. The above-mentioned differential coil 113 removes a magnetic flux induced by the above-mentioned exciting coil 112 among magnetic fluxes from the circuit board 4 so as to detect only the magnetic flux generated by the eddy current; thus, the induction voltage, generated in this differential coil 113, is inputted to the multiplying circuit 118 through the preamplifier 117.

The above-mentioned phase circuit 116 to which the above-mentioned high frequency current is given through a connection path from the exciting coil 112 to the ground is allowed to set a signal having a phase that is the same as the phase indicated by this current or different from the phase by a predetermined amount (hereinafter, the phase set in this phase circuit is referred to as "set phase".)

This set phase is given to the multiplying circuit 118 so that a signal having the set phase is taken out from the induction voltage of the differential coil 113. This detected signal is further subjected to an integration process in the integration circuit 119, and the result of the process is outputted to the control device 3 as a final detection signal $Vi_o$.

Here, supposing that the current flowing through the exciting coil 112 is id, the exciting magnetic field, generated by the exciting coil 112, is Φd, and the voltage inducted on the circuit board 4 by this excited magnetic field is ed, Φ d and ed are represented by the following equations (1)(2). Here, Nc in equation (1) is a coefficient determined by the inductance and the number of windings of the exciting coil 112.

$$\Phi d = id \cdot Nc \tag{1}$$

$$ed = d\Phi d/dt = -J\omega \Phi d \tag{2}$$

Moreover, in the circuit containing a resistor, a capacitor and a coil, the eddy current ie that is allowed to flow through the circuit by the above-mentioned induced voltage ed is represented by equation (3):

$$ie = Z/ed \qquad (3)$$
$$= (R + J\omega L - j1/\omega c)/-j\omega\Phi d$$
$$= -jR/\omega\Phi d - L/\Phi d + 1/\omega^2 c\Phi d$$

Moreover, the magnetic field Φe, generated by this eddy current ie, is represented by equation (4); therefore, the voltage Ee, induced by the differential coil 113, is represented by equation (5). Here, Ns in equation (4) is a coefficient determined by the circuit construction.

$$\Phi d = ie \cdot Ns \qquad (4)$$
$$Ee = -d\Phi e/dt$$
$$= -J\omega\Phi e$$
$$= R \cdot Ns/\Phi d + j\omega L \cdot Ns/\Phi d - j1/\omega c \cdot Ns/\Phi d$$

(same phase signal) (90° delayed signal)      (5)
(90° advanced signal)

In this manner, in the above-mentioned differential coil 113, the induced voltage that represents the respective signals of the resistor, coil and capacitor is obtained; therefore, for example, by setting the phase advancing from the induced magnetic field by 90° in the phase circuit 116, the induced voltage representing the signal of the capacitor is detected, and the above-mentioned set phase is then switched to the phase delayed from the induced magnetic field by 90° so that the induced voltage representing the coil signal is detected. In this manner, by switching the set phase, the induced voltage derived from each of the kinds of parts can be detected in a separated manner. Here, the switching operation of the phase circuit 116 can be controlled by the control device 3.

Figure 13:
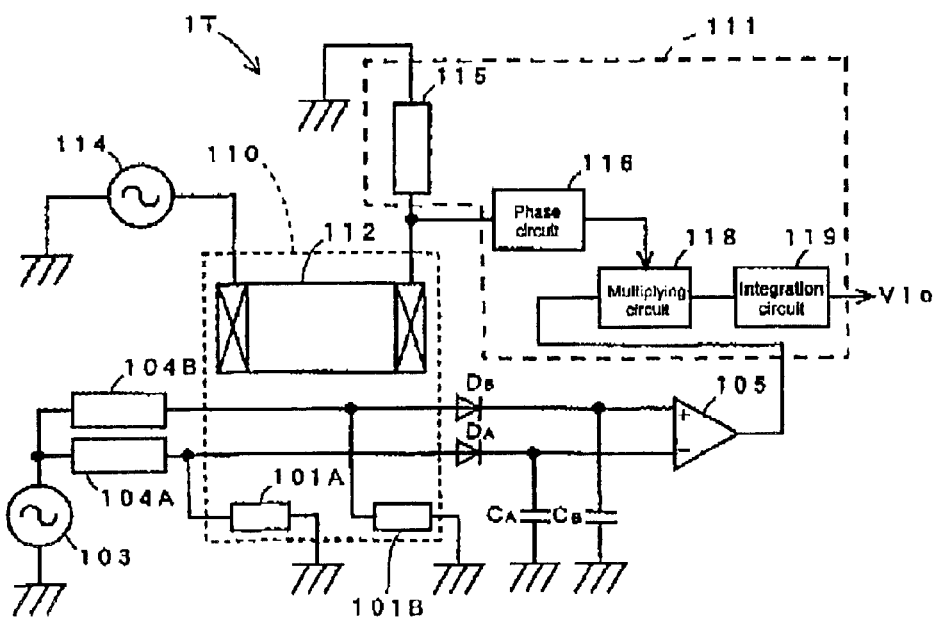
FIG. 13 is a drawing that shows another electrical structure of a detection unit to be used in the second inspection apparatus.
Figure 14:
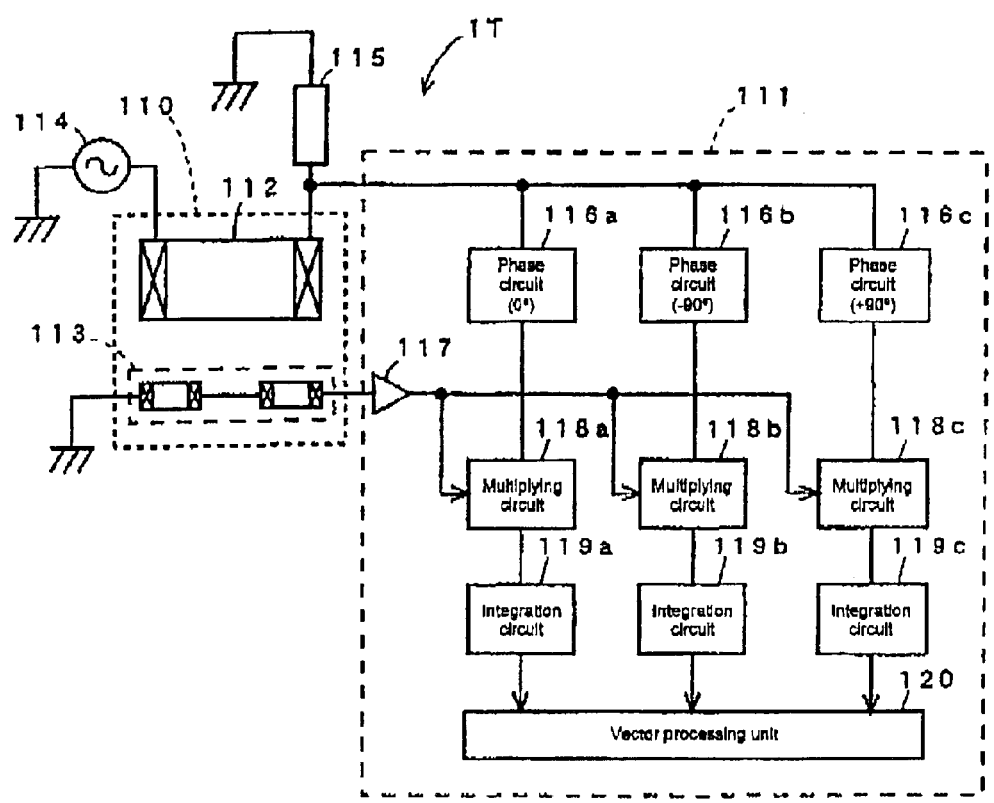
FIG. 14 is a drawing that shows still another electrical structure of a detection unit to be used in the second inspection apparatus.

FIGS. 13, 14 show another construction of the detection unit 1T.

The detection unit 1T in FIG. 13 is designed so that, in the sensor main body 110, a magnetic field, caused by the eddy current, is detected by using a differential signal from a pair of MI elements 101A, 101B, in place of the above-mentioned differential coil 112. Here, the construction used for obtaining a differential signal by the MI element 101A, 101B is the same as that shown in FIG. 8, and the construction of the processing circuit 111 is the same as that shown in FIG. 12; therefore, those parts having the same functions are indicated by the same reference numerals, and the detailed description thereof is omitted.

In the detection unit 1T shown in FIG. 14, although the construction of the sensor main body 110 is the same as that shown in FIG. 12, the processing circuit 111 is provided with three sets of circuits, each set consisting of a phase circuit 116, a multiplying circuit 118 and an integration circuit 119, which are placed in parallel with each other. (In the Figure, the respective combinations are represented by a, b and c in a separated manner.) Moreover, a vector processing unit 120 is placed at the succeeding stage of the respective integration circuits 119a, 119b and 119c.

The same phase as that of the induction magnetic field of the exciting coil 112, the phase having a 90° delay therefrom and the phase having a 90° advance therefrom are respectively set in the respective phase circuits 116a, 116b and 116c. The induction voltage of the above-mentioned differential coil 113 is simultaneously applied to the respective multiplying circuits 118a, 118b and 119c, and the set phases in the phase circuits 116a, 116b and 116c at the preceding stage are also inputted thereto. Thus, the resistor component, the coil component and the capacitor component that are contained in the induction voltage generated in the differential coil 113 are simultaneously detected in a separate manner, and the detected components are inputted to the vector processing unit 120 through the integration circuits 119a, 119b and 119c.

The vector processing unit 120 subjects the detected components to digital processes, forms array data that have these components as the respective elements of three-dimensional vectors or data indicating the direction and length of each vector, and outputs the resulting data as a detection signal.

In accordance with an inspection apparatus having the above-mentioned second construction, after the circuit board 4 has been transported to an inspection position, the inspection unit 1T is successively positioned at respective inspection subject areas with no current being applied to the circuit board 4, to carry out inspecting processes. In the respective inspection subject areas, while a high frequency induction magnetic field is being exerted on the circuit board 4, a magnetic field distribution, caused by an eddy current from each inspection subject area, is detected, and compared with reference data that has been preliminarily registered. Here, as described earlier, in the case when the closed loop on the circuit board 4 has become a state different from the normal state due to a defect such as a disconnection and a short-circuiting, since a magnetic field distribution different from the reference data is obtained so that it is possible to detect even a defect that would not be reflected to an electrical potential and an electric current in the case of application of a current to the circuit board 4, with high precision.

In the same manner as the second inspection apparatus, the third inspection apparatus also carries out an inspecting process with no current being applied to the circuit board 4; however, in this apparatus, in place of the above-mentioned magnetic field and electric field, an ultrasonic wave is used for detecting any defect on the circuit board 4.

Here, in the same manner as the second inspection apparatus, in the third inspection apparatus also, the position adjusting device 2 and the control device 3 have the same constructions as those of the first and second apparatuses; therefore, the following description will only discuss the construction of the detection unit 1, and with respect to the construction of the entire inspection apparatus, drawing and description thereof are omitted.

FIG. 15 shows a structural example of a detection unit 1S used in the third inspection apparatus.

A detection unit 1S of the present preferred embodiment, which has a cylinder-shaped case 130 as a main body, is supported above a circuit board 4 by a position adjusting mechanism so as to freely shift. A piezoelectric element 132 and an acoustic matching layer 133 are laminated as upper and lower layers at a lower position inside the case, and a sensor substrate 134 in which a processing circuit which will be described below is installed, electrode terminals 135a, 135b that relay this sensor substrate 134 to the piezoelectric element 132, etc. are assembled therein.

The above-mentioned piezoelectric element 132 is allowed to vibrate upon receipt of a driving current from a high frequency oscillator, not shown, to generate an ultrasonic wave, and receives a reflected wave from the circuit board 4 so as to generate a voltage corresponding to the level of the received wave. The acoustic matching layer 133 subjects the ultrasonic wave generated by the piezoelectric element 132 to a matching process with respect to the vibration characteristic, and transmits this to the air: Here, in the above-mentioned case 130, the piezoelectric element 132 is surrounded by a resin buffer member 136 on its sides and its upper portion, with the above-mentioned electrode terminals 135a, 135b being supported by a terminal holder 137 at a position above this.

Figure 16:
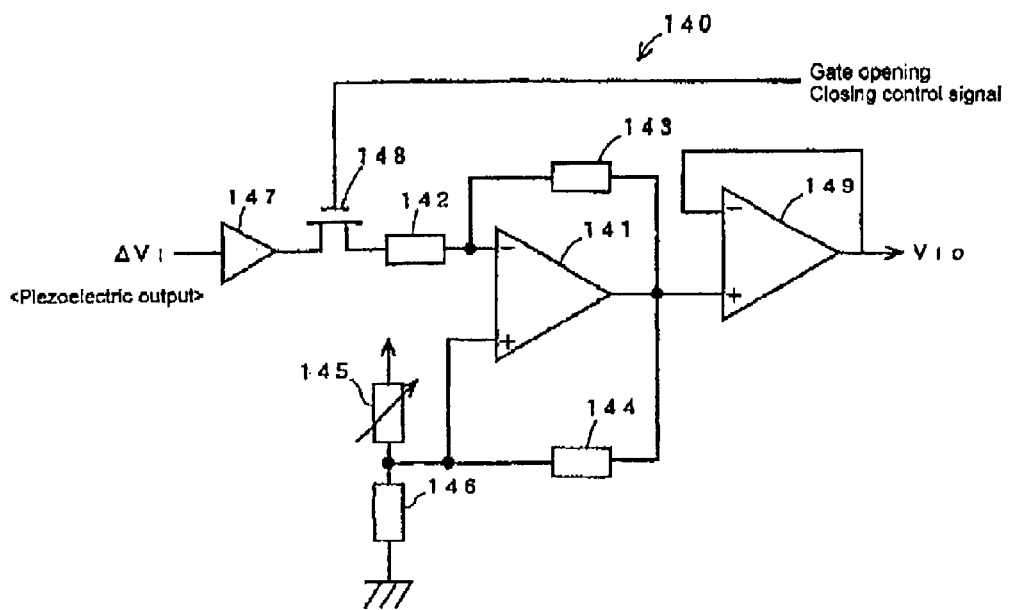
FIG. 16 is a drawing that shows an electrical structure of the detection unit of FIG. 15.

FIG. 16 shows a structural example of a processing circuit 140 which processes an output (indicated by "piezoelectric output ΔVi" in the drawing) from the piezoelectric element 132.

This processing circuit 140, which acquires the piezoelectric output ΔVi in synchronized timing with the receipt of the reflected wave from the circuit board 4, and carries out an amplifying process on this, is mainly constituted by an operation amplifier 141. Here, the operation amplifier 141 is designed to a positive feed-back type so as to adjust the offset level of the detected voltage in the case when no reflected wave is received; thus, feed-back resistors 142, 143 and voltage-setting resistors 145, 146 are connected thereto, and a hysteresis adjusting resistor 144 is placed between the input and output on the +side.

A pre-amplifier 147 and a gate circuit 140 are placed at the preceding stage of the operation amplifier 141, and a buffer circuit 149 is placed at the succeeding stage thereof. A control signal has been given to the gate circuit 148 by a control circuit, not shown, or the above-mentioned control device 3, and after a piezoelectric output ΔVi, given while the gate circuit 148 is open, has been acquired by the operation amplifier 141, and amplified therein, the signal $Vi_0$, given through the buffer circuit 149 located at the succeeding stage, is inputted to the control device 3 as a detection signal. Here, the above-mentioned control signal is set so that, after the gate has been closed until a reflected wave has been received from the circuit board 4 since the transmission of an ultrasonic wave by the piezoelectric element 132, the gate is opened for a predetermined time.

FIG. 17 shows cases in which transmitting and receiving processes of ultrasonic waves make it possible to detect any defect.

FIG. 17(1) shows a detection process for a part 6 having a normally packaged state in which the level of an ultrasonic wave to be transmitted to the circuit board 4 (hereinafter, referred to as "transmission wave level") is represented by Ft, and the level of a reflected wave received from this part (hereinafter, referred to as "received wave level") is represented by Fr. Here, FIGS. 17(2) to 17 (4) show detection processes that are applied when any defect occurs in the part 6 or in the mounted state thereof; and these Figures show states on the assumption that, with respect to the transmission wave having the same transmission level Ft as that shown in FIG. 17(1), reflected waves having respective received wave levels of Fr1, Fr2, Fr3 are obtained. Here, in the Figures, reference numeral 8 represents a soldered portion.

FIG. 17(2) shows detection processes that are carried out under the condition that a crack occurs in the part 6 or a disconnection occurs inside the part. In this case, it is considered that, since one portion of the transmission wave is absorbed inside the part 6, the received wave level Fr1 becomes smaller than the level Fr in the normal state.

FIG. 17(3) shows detection processes that are carried out when there is a defect in soldering such as a hollow soldered portion due to excessive soldering and an insufficiently soldered portion and the subsequent rise of the part. When an ultrasonic wave is applied to a part 6 having such a defective soldered portion, local vibration occurs in the hollow portion of the soldered portion 8 and the part 6, with the result that one portion of the transmission wave is absorbed by a wiring pattern 7 and the part 6, or reflected in a direction different from the normal state. Therefore, in this case also, it is considered that the received wave level Fr2 becomes smaller than the level Fr in the normal state.

FIG. 17(4) shows detection processes that are carried out when a crack or a disconnection occurs in the wiring pattern 7. When an ultrasonic wave is applied to a portion having such a defect, local vibration occurs in the disconnected wiring pattern 7 and the part 6, with the result that one portion of the transmission wave is absorbed by a wiring pattern 7 and the part 6, or reflected in a direction different from the normal state. Therefore, in this case also, it is considered that the received wave level Fr3 becomes smaller than the level Fr in the normal state, in the same manner as the cases of FIGS. 17(2), 17(3).

In this manner, in the event of any defect in the circuit board 4, even when an ultrasonic wave having the same level Ft as that in the normal state is applied thereto, the level of a reflected wave to the detection unit 1 is varied due to a variation in the reflection state of the ultrasonic wave. Therefore, with the conditions of the transmission wave being maintained constant, the reflected wave from each detection subject area is received, and by comparing the level of the reflected wave with reference data that has been preliminarily registered, it is possible to detect whether or not any defect exists with high precision.

Here, since the inspection subject area on the circuit board 4 is extremely small, the detection unit 1 to be used in the third detection apparatus is preferably designed so that it can emit an ultrasonic wave that exhibits abrupt rises locally.

Moreover, in an arrangement in which an ultrasonic wave having a specific frequency is transmitted to the inspection subject area so as to give an impulse and the frequency spectrum of the reflected wave is observed, the reflected wave comes to have a difference in its frequency spectrum depending on the cases in which the inspection subject area is good and in which there is any defect therein. Therefore, an attempt is made so as to variably set the frequency of the above-mentioned ultrasonic wave within a predetermined frequency range, and in this arrangement, an ultrasonic wave having a certain set frequency is transmitted, and by extracting a reflected wave component having a tuning frequency, it becomes possible to determine whether or not any defect exists. Moreover, when an attempt is made so as to variably set the level of the transmission wave, the level of the transmission wave can be adjusted to an optimal level fox receiving the reflected wave having the above-mentioned tuning frequency, thereby making it possible to carry out an inspection with high precision.

In any of the above-mentioned first and third inspection apparatuses, prior to the inspection, a teaching process for registering reference data used for determining the inspection subject area and whether or not any defect exists is carried out, and the inspecting process is then executed. The main sequences of these teaching processes and the inspection processes are in common with any of the inspection apparatuses; therefore, the following description will briefly discuss the sequences of these common processes. In the following explanation, with respect to the inspection units 1, 1S, 1T of the respective inspection apparatuses, these are generally referred to as "inspection unit 1" for convenience of explanation.

Figure 18:
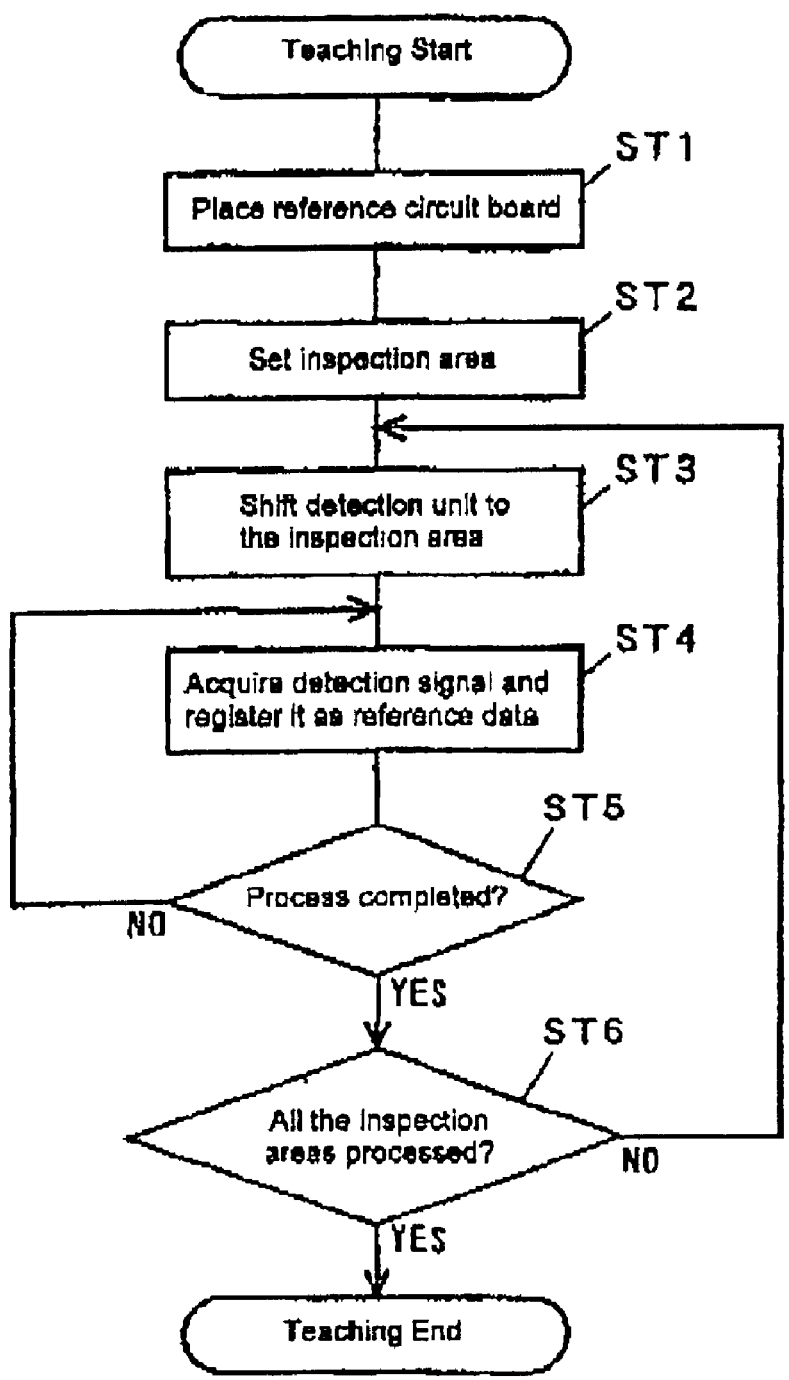
FIG. 18 is a flow chart that shows the sequence of teaching processes.

FIG. 18 shows a sequence of teaching processes (hereinafter, the respective steps are indicated as "ST").

The teaching processes are carried out by using a good circuit board without any defective portion (hereinafter, this is referred to as "reference circuit board">. First, at ST1, a reference circuit board is placed on to an inspection position.

Here, in the case when the first inspection apparatus is used, a current is applied to the circuit board at this step ST1; however, in the case when the second and third inspection apparatuses are used, the sequence proceeds to the following steps without applying a current to the circuit board.

At the next step ST2, the operator is allowed to set an inspection subject area. After this setting has been made, the setting position, the size, etc. of the inspection subject area are registered in a memory, and the sequence proceeds to the next step ST3.

Here, at ST2, by using a method in which map information of the circuit board, preliminarily stored, is displayed so as to allow the operator to specify the inspection subject area on the map, it is possible to easily acquire setting data of the inspection subject area. Alternatively, default setting data is preliminarily registered as the inspection subject area, and at ST2, this setting data is displayed so as to allow the operator to confirm the data, and the setting data may be revised only when an instruction for a revision is given.

Here, the inspection subject area may be set to a desired size. Moreover, in the case when a redundant circuit has been set, the inspection subject area may be set in a manner so as to include the entire portion of this redundant circuit, or the inspection subject area may be set on each branched circuit basis.

When the inspection subject area has been set in this manner, at ST3, the detection unit 1 is shifted to the first inspection subject area. Then, within this inspection subject area, the detection unit 1 is allowed to carry out detecting processes at a plurality of positions while being moved therein, and a detection signal indicating the results of the detection is acquired, and registered in a memory as reference data (ST4, 5). Here, this acquiring process of this detection signal may be carried out at positions specified by the operator within the inspection subject area, or detection processes may be carried out successively every predetermined interval.

Moreover, in the case when the second inspection apparatus is used, at the above-mentioned ST4, in accordance with kinds of parts within the inspection subject area, the setting phase to the phase circuit 116 and the order of switching of the set phase are determined, and these may be registered in the memory as the inspection conditions. Moreover, in the case when the third inspection apparatus is used, at ST4, the timing in which the above-mentioned gate circuit 148 is opened and closed is determined, and these may be registered in the memory as inspection conditions.

Upon completion of the processes within the inspection subject area in this manner, "YES" is given at ST5, and after the sequence has returned from ST6 to ST3, the same processes are executed on the next inspection subject area.

In the same manner as described above, the detection unit 1 is shifted to the respective inspection subject-area and the detection process is carried out while the detection unit 1 is being moved within the area so that the reference data is accumulated successively. Here, the respective reference data is desirably set to have a data structure in which in addition to the value of the detection signal obtained from the detection unit 1, the coordinate position of the detection unit 1 upon acquiring the detection signal is associated with the value.

Upon completion of the processes on all the inspection subject areas, "YES" is given at ST6, thereby completing the teaching processes.

Figure 19:
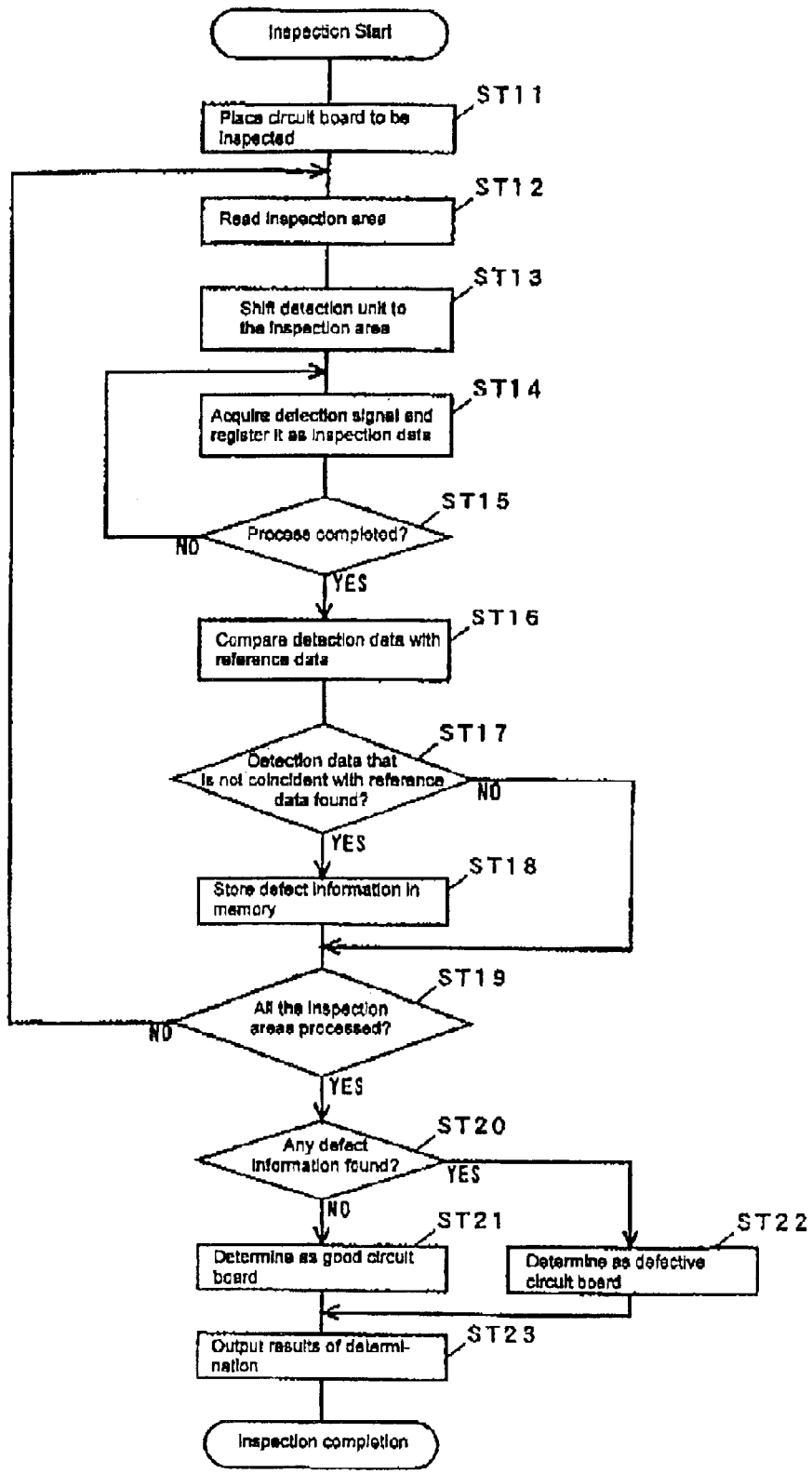
FIG. 19 is a flow chart that shows the sequence of detecting processes.
Figure 20:
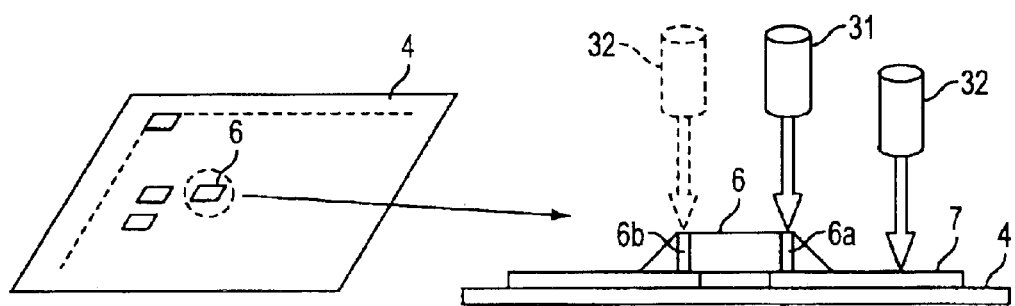
FIG. 20 is a drawing that shows a conventional detection method.

FIG. 19 shows the processing sequence at the time of the inspection. Here, in FIG. 19, the steps of the respective processes are indicated by symbols of ST11 and thereafter so that these are not mixed with the aforementioned teaching sequence.

First, at step ST11, a circuit board 4 to be inspected is shifted and positioned onto an inspection position. Here, in the case when the first inspection apparatus is used, a current is applied to the circuit board 4; however, in the case when the second and third inspection apparatuses are used, the following steps are carried out without applying a current to the circuit board 4.

At the next step ST12, the inspection subject area registered in the above-mentioned memory is read out, and at ST13, the detection unit 1 is shifted to this inspection subject area.

Next, a detection process is carried out on each position corresponding to the above-mentioned reference data while the detection unit 1 is being moved within the above-mentioned inspection subject area (ST14, 15). The detection signal obtained through this process is stored in the memory as inspection data.

Upon completion of the processes within the inspection subject area, "YES"[1] is given at ST15, and the sequence proceeds to ST16, where the inspection data is compared with the reference data. Here, in this comparing process, for example, a difference is found between the inspection data and the reference data, and when the difference value exceeds a predetermined threshold value, it is determined that the two values are not coincident with each other.

When there is any inspection data that is not coincident with the reference data in the above-mentioned comparing process, "YES" is given at the next step ST17, and the sequence proceeds to ST16 where the position at which this inspection data is obtained, the degree of non-coincidence, etc. are stored in the memory as defect information. Thereafter, the sequence returns from ST19 to ST12, and the same processes are executed on the next inspection subject area.

Upon completion of processes with respect to the entire inspection subject areas in this manner, "YES" is given at ST19, and the sequence proceeds to ST20 where a determination is made as to whether or not any detect information has been stored in the memory. Here, if no defect information has been stored, the sequence proceeds to ST21 in which the circuit board 4 that has been inspected is determined as a good circuit board. In contrast, if any defect information has been stored, the sequence proceeds to ST22 in which the circuit board 4 that has been inspected is determined as a defective circuit board.

Upon completion of determination as to a good or defective circuit board, the sequence proceeds to ST23, and the result of the determination is outputted. Here, in the case of determination as a defective circuit board at ST22, it is preferable to output detailed information including the defect information and the position of the inspection subject area, together with the results of the determination.

As described above, in the present invention, a printed circuit board is observed in a non-contact state to the circuit board and the determining process is carried out by detecting a physical quantity representing whether or not any defect exists; therefore, even when the inspection subject is a circuit board with high density, it is possible to carry out the inspection with high precision without causing any damage to the circuit of the circuit board. Moreover, with respect to a circuit including a part formed by a face-down packaging process, it is possible to carry out inspection processes in a non-contact state.

In particular, in the second and third methods of the present invention, a magnetic field or an ultrasonic wave is applied to a circuit board with no current being applied thereto, and the determining process is carried out by using a physical quantity (reflection wave of the magnetic field or the ultrasonic wave caused by an eddy current) generated by the applications therefore, it becomes possible to detect any defect that has not been detected since no change occurs in the electrical potential and electric current in the inspection with a current being applied to the circuit board; thus, it becomes possible to greatly improve the detection precision.

What is claimed is:

1. A method for inspecting a printed circuit board comprising the steps of:

applying a current to said printed circuit board;

detecting a distribution state of a magnetic field generated by the current on said printed circuit board while varying relative positions to said printed circuit board with a non-contact state to said printed circuit board being maintained using a magnetic field sensing structure, the magnetic field sensing structure having multiple sensor units; and determining whether or not any defect exists in said printed circuit board based upon the results of said detecting.

2. The method for inspecting a printed circuit board according to claim 1, wherein said printed circuit board has an area including a wiring pattern or parts constituting at least redundant circuit as an object for inspection.

3. The method for inspecting a printed circuit board according claim 1, wherein: a detecting process is preliminarily carried out on a good circuit board without any defect under the same conditions as a circuit board that is an object for inspection so as to register the results of the inspection as reference data, and upon inspection, a determination is made as to whether or not any defect exists by comparing the results of inspection obtained with respect to an object for inspection with said reference data.

4. An apparatus for inspecting a printed circuit board comprising:

a detection unit which detects a distribution state of a magnetic field generated by the current on said printed circuit board while being set in a non-contact state with respect to said printed circuit board, the detection unit comprising a magnetic field sensing structure having multiple sensor units;

position adjusting means for adjusting a relative positional relationship between said detection unit and said printed circuit board; and control means configured to control said position adjusting means to adjust the relative positional relationship between said detection unit and said printed circuit board while the detection unit detects the distribution state of a magnetic field so that a determination is made as to whether or not any defect exists in said printed circuit board by using detection signals from the detection unit corresponding to respective relative positions.

* * * * *